United States Patent
Lin et al.

(10) Patent No.: US 7,492,197 B2
(45) Date of Patent: Feb. 17, 2009

(54) CHARGE PUMP CIRCUIT WITH REGULATED CURRENT OUTPUT

(75) Inventors: Chia-Liang Lin, Union City, CA (US); Gerchih Chou, San Jose, CA (US); Chi-Kung Kuan, Tao-Yuan Hsien (TW)

(73) Assignee: Realtek Semiconductor Corp., Science Park, HsinChu (TW)

( * ) Notice: Subject to any disclaimer, the term of this patent is extended or adjusted under 35 U.S.C. 154(b) by 42 days.

(21) Appl. No.: 11/559,890

(22) Filed: Nov. 14, 2006

(65) Prior Publication Data

US 2007/0109031 A1    May 17, 2007

Related U.S. Application Data

(60) Provisional application No. 60/597,211, filed on Nov. 17, 2005.

(51) Int. Cl.
*H03L 7/06* (2006.01)
(52) U.S. Cl. .................................................. 327/157
(58) Field of Classification Search ............... 327/148, 327/157
See application file for complete search history.

(56) References Cited

U.S. PATENT DOCUMENTS

| | | | |
|---|---|---|---|
| 6,181,210 B1 * | 1/2001 | Wakayama | 331/8 |
| 6,326,852 B1 * | 12/2001 | Wakayama | 331/17 |
| 6,812,754 B1 * | 11/2004 | Nakanishi | 327/157 |
| 6,850,102 B2 * | 2/2005 | Hsu et al. | 327/157 |
| 6,897,733 B2 * | 5/2005 | Wakayama | 331/17 |
| 6,914,491 B2 * | 7/2005 | Derksen | 331/17 |
| 6,998,891 B2 * | 2/2006 | Hsu et al. | 327/157 |
| 7,042,261 B2 * | 5/2006 | Lee et al. | 327/157 |
| 7,129,800 B2 * | 10/2006 | Gauthier et al. | 331/175 |
| 7,138,838 B2 * | 11/2006 | Shibahara et al. | 327/157 |
| 7,184,510 B2 * | 2/2007 | Jung | 375/374 |
| 7,193,479 B2 * | 3/2007 | Fujita | 331/16 |
| 2003/0076141 A1 * | 4/2003 | Hsu et al. | 327/157 |
| 2005/0099215 A1 * | 5/2005 | Hsu et al. | 327/157 |

* cited by examiner

*Primary Examiner*—Donovan Lincoln
*Assistant Examiner*—Adam D Houston
(74) *Attorney, Agent, or Firm*—Winston Hsu

(57) ABSTRACT

The output current of a current sink is regulated by a reference current provided by a current source and a reference voltage obtained by filtering the output voltage of the current sink. The current sink to be regulated is a voltage control current source, where the control voltage is obtained by amplifying the difference between the reference voltage and the output voltage of the current source.

27 Claims, 5 Drawing Sheets

CHARGE PUMP CIRCUIT WITH REGULATED CURRENT OUTPUT

REFERENCE TO RELATED APPLICATIONS

This application claims priority of U.S. Provisional Patent Application Ser. No. 60/597,211, entitled "CHARGE PUMP CIRCUIT WITH REGULATED CURRENT OUTPUT", filed on Nov. 17, 2005, the content of which is incorporated by reference herein.

BACKGROUND OF THE INVENTION

1. Field of the Invention

The present invention relates generally to charge pump circuits, and more particularly but not exclusively to methods and apparatus for regulating the output current for a charge pump circuit.

2. Description of the Background Art

A typical PLL (phase lock loop) comprises a PFD (phase/frequency detector), a charge pump circuit, a loop filter, and a VCO (voltage controlled oscillator). The PFD compares the phase of a reference clock with that of the output clock of the VCO. Usually two logical signals, said UP and DN signals are used by the PFD to represent the phase difference between the two clocks. Each time a phase comparison is made, an UP pulse and a DN pulse are generated. If the reference clock is leading the VCO output clock (in clock phase), the UP pulse is longer than the DN pulse. Otherwise, the DN pulse is longer than the UP pulse. The two logical signals are converted into a current signal using the charge pump circuit. FIG. 1 schematically depicts a prior art charge pump circuit. Throughout this disclosure, VDD denotes a supply voltage. The charge pump circuit comprises a current source 110 of magnitude I, a switch 120 controlled by the UP signal, a current sink 130 of magnitude I, and a switch 140 controlled by the DN signal. When UP is 1 and DN is 0, the output current IOUT is positive (i.e. out-flowing). When UP is 0 and DN is 1, the output current IOUT is negative (i.e. in-flowing). When UP is 0 and DN is 0, or UP is 1 and DN is 1, the output current IOUT is zero. The output of the charge pump is connected to the loop filter, which typically comprises a resistor in series with a capacitor to convert the output current from the charge pump into a voltage, which is used to control the VCO.

In practice, however, the prior art charge pump circuits shown in FIG. 1 are prone to problems due to circuit non-idealities. First, the magnitude of the current source 110 may not be exactly the same as that of the current sink 130 due to variation within the manufacturing process. Second, a practical current source/sink always has finite output impedance, and therefore the output current is always load-dependent.

FIG. 2 schematically shows an equivalent circuit of the charge pump circuit depicted in FIG. 1 in practical conditions. The current source 110 in FIG. 1 is replaced by a practical current source 250 comprising an ideal current source 210 of magnitude I1 in parallel with a resistor R1. The current sink 130 in FIG. 1 is replaced by a practical current sink 260 comprising an ideal current sink 230 of magnitude I2 in parallel with a resistor R2. As a result, there is a mismatch between the current source and the current sink, and also the mismatch is load-dependent. When the output voltage at the load increases/decreases, the current flowing out of the practical current source 250 will decrease/increase, while the current flowing into the practical current sink 260 will increase/decrease. Therefore, even if I1 is made exactly the same as I2, there is still a load-dependent mismatch between the current source 250 and the current sink 260. The mismatch between the current source and the current sink usually results in appreciable degradation to the PLL performance, most noticeably in causing spurious frequency components.

Prior arts rely on circuit design techniques to guarantee a good matching between the current source and the current sink, and also a high output resistance for both the current source and the current sink. In a CMOS integrated circuit implementation, for example, people may use large transistors to assure good matching. A good matching is thus achieved at the cost of increased circuit area. Also, people may use a "cascode" topology by stacking up transistors to achieve a high output resistance when implementing a current source/sink. A high output resistance is thus achieved at the cost of reduced output voltage range.

What is needed is an improved charge pump circuit that is self-regulated so that the current source and current sink match well regardless of voltage at the load without sacrificing much output voltage range.

SUMMARY

In an embodiment, a circuit is disclosed, the circuit comprising: a current sink coupled to a first node of a filter circuit via a first switch controlled by a logical signal; and a current source coupled to an output of the current sink via a second switch controlled by an inversion of the logical signal, wherein the current sink is adjusted based on a voltage of a second node of the filter circuit. The current sink is adjusted in a closed loop to force an output voltage of the current source to track the voltage of the second node of the filter circuit.

In an embodiment, a method of regulating a current sink is disclosed, the method comprising: coupling a current sink to a first node of a filter circuit via a first switch controlled by a logical signal; coupling a current source to an output of the current sink via a second switch controlled by an inversion of the logical signal; and adjusting the current sink based on a voltage of a second node of the filter circuit. The current sink is adjusted in a closed loop to force an output voltage of the first current source to track the voltage of the second node of the filter circuit.

These and other features of the present invention will be readily apparent to persons of ordinary skill in the art upon reading the entirety of this disclosure, which includes the accompanying drawings and claims.

DETAILED DESCRIPTION

In the present disclosure, numerous specific details are provided, such as examples of apparatus, circuits, components, and methods, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
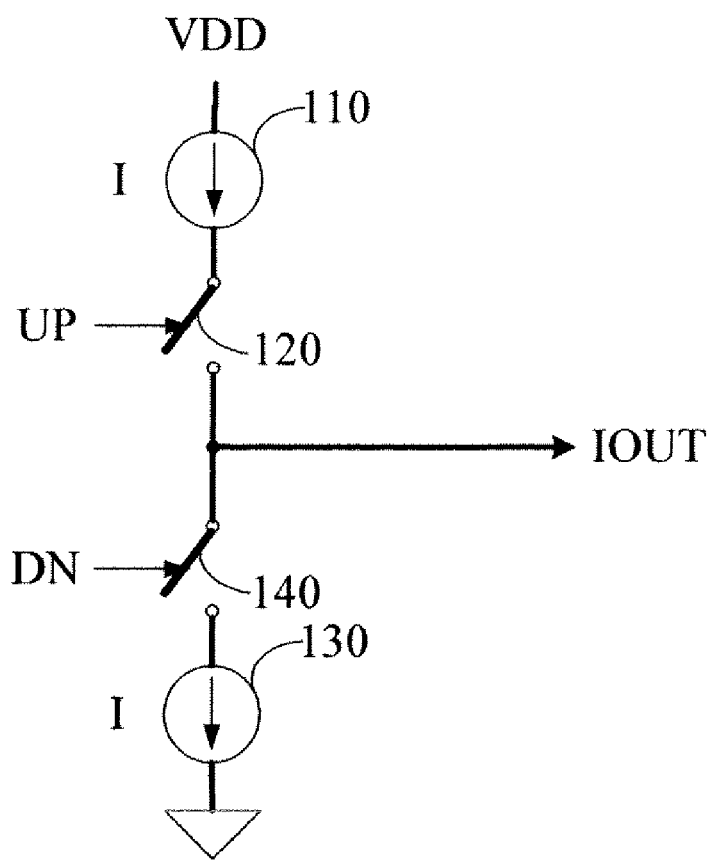
FIG. 1 shows a prior art charge pump circuit.
Figure 2:
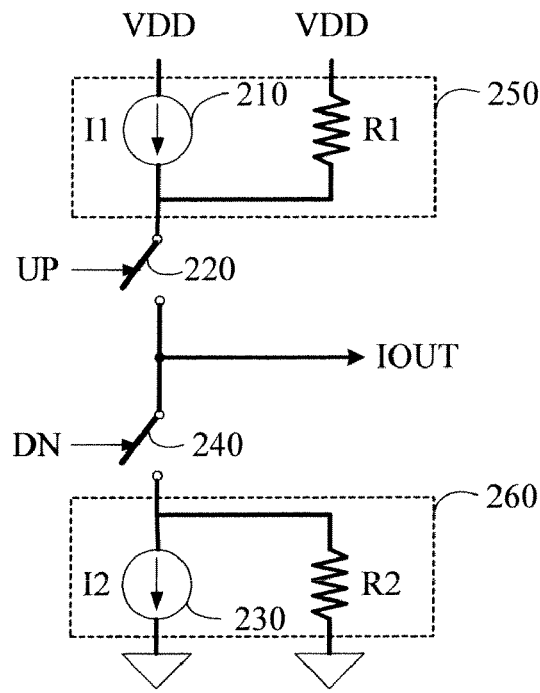
FIG. 2 shows an equivalent circuit of the prior art charge pump circuit.
Figure 3:
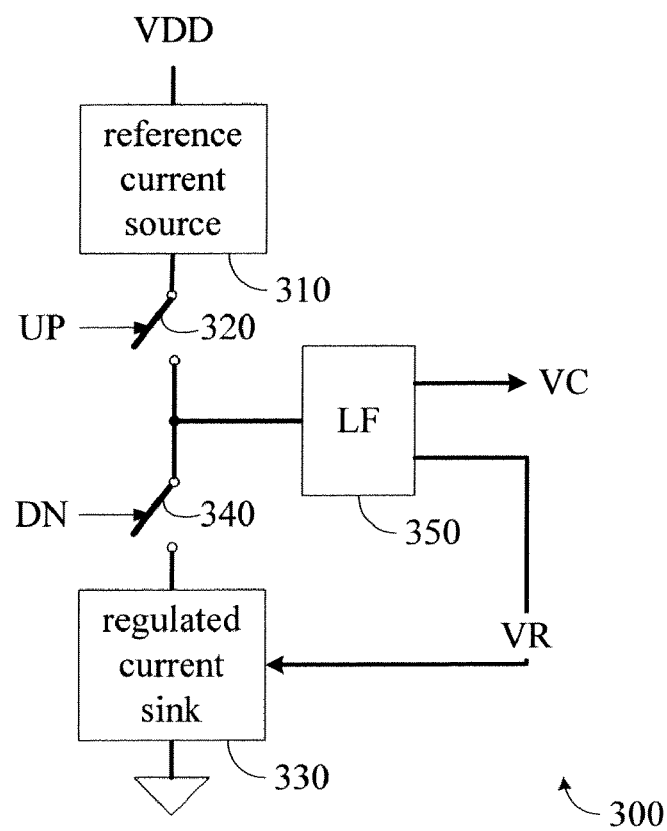
FIG. 3 shows a combined circuit of charge pump and loop filter in an embodiment of the present invention.

FIG. 3 depicts a schematic diagram of a combined circuit 300 of charge pump and loop filter according to an embodiment of the present invention. In this embodiment, a reference current source 310 is used to generate a reference positive (i.e. out-flowing) current of magnitude IREF. A switch 320 controlled by the UP signal is used to enable the positive current to flow out to the loop filter 350. On the other hand, a regulated current sink 330 is used to generate a regulated negative (i.e. in-flowing) current. A switch 340 controlled by the DN signal is used to enable the negative current to flow in from the loop filter 350. The loop filter generates two outputs: VC and VR. VC is the main output of the loop filter 350, and is provided to a VCO (not shown in the figure) to control its output frequency. VR is obtained from VC using a low pass filtering function, explicitly or implicitly implemented within the loop filter 350. The voltage VR is then provided to the regulated current sink 330 as a reference voltage to regulate its output current. The reference voltage VR represents the average voltage at the load (i.e. loop filter) shared by the current source 310 and the current sink 330. The regulated current sink 330 comprises a VCCS (voltage controlled current sink) and a feedback circuit. When the voltage at the load (i.e. loop filter) increases/decreases, the voltage VR also increases/decreases, and the output current of VCCS tends to increase/decrease due to its finite output resistance. A feedback mechanism within the regulated current source 330, however, senses that change and adjusts the control voltage of the VCCS to reduce/boost the output current to offset the increase/decrease due to the finite output resistance. The output current of the VCCS is thus regulated.

Figure 4:
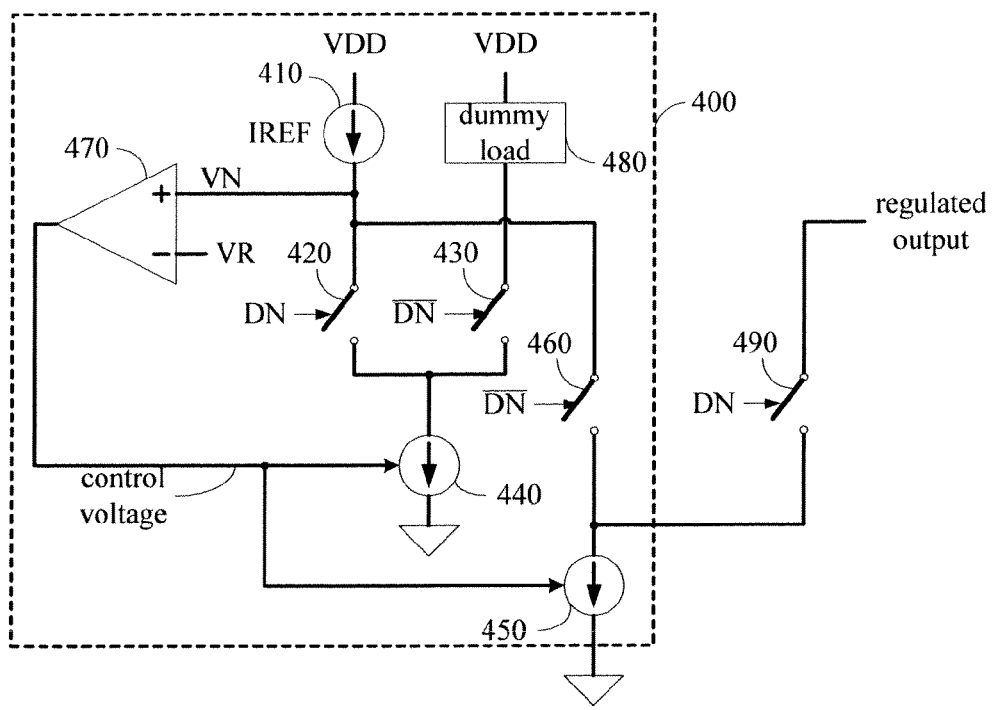
FIG. 4 shows an example embodiment a regulated current sink.

FIG. 4 shows the schematic diagram of a regulated current sink 400, which is an example embodiment of the regulated current sink 330 shown in FIG. 3. In this embodiment, the regulated current sink 400 comprises a reference current source 410 of magnitude IREF, a pair of switches 420 and 460 controlled by DN and $\overline{DN}$ (i.e. logical inversion of DN) respectively, a pair of VCCS (voltage controlled current sink) 440 and 450, another switch 430 controlled by $\overline{DN}$, a dummy load 480, and an operational amplifier 470. VCCS 450 is the current sink to be regulated. The output of VCCS 450 is connected to yet another switch 490 controlled by DN, which is the same as the switch 340 in FIG. 3. Based on the ON/OFF status of the four switches 420, 430, 460, and 490, the regulated current sink 400 works in a two-phase manner. When DN==1, it is said to be in "OUTPUT" phase; when DN==0, it is said to be in "CALIBRATION" phase.

During CALIBRATION phase, VCCS 450 is disconnected from the load (i.e. loop filter) but connected to current source 410 through switch 460. In the mean while, VCCS 440 is connected to the dummy load 480 through switch 430. The purpose of introducing the dummy load 480 is to ensure a proper termination for VCCS 440 during CALIBRATION phase. A dummy load usually comprises a resistor or a transistor. If the reference voltage VR increases/decreases, i.e. the average voltage at the load increases/increases, the negative feedback provided by operational amplifier 470 will cause the control voltage of VCCS 450 to decrease/increase and thus decrease/increase the output current for VCCS 450. In this manner, the voltage VN (i.e. the voltage at the output of current source 410) will track the reference voltage VR due to the high gain provided by the operational amplifier 470, while the output current of VCCS 450 will track the reference current IREF. The effect of finite output resistance of VCCS 450, which tends to increase/decrease the output current when the voltage at the load increases/decreases, is thus been compensated due to the negative feedback.

During OUTPUT phase, VCCS 450 is connected to the load (loop filter) through switch 490. In the mean while, VCCS 440 is connected to the current source 410 through switch 420. The negative feedback continues to work to force voltage VN to track the reference voltage VR and force the output current of VCCS 440 to track the reference current IREF. Since the control voltage is the same for both VCCS 440 and VCCS 450, and the average output voltage is also the same (since VN is tracking VR), the output current will be the same for both VCCS 440 and VCCS 450. In this manner, the output current of VCCS 450 is regulated to be IREF.

Note that both the current source 310 of FIG. 3 and the current source 410 of FIG. 4 need to have an accurate magnitude of IREF. They can be implemented by using, for example, a "cascode" topology. While prior arts require an accurate current source and an accurate current sink to guarantee an accurate output current for a charge pump circuit, this present invention only requires an accurate current source since the current sink will be regulated accordingly. Therefore, the current invention offers an improvement on the useful output range over prior art.

There are many ways to implement the current source 310 of FIG. 3 and the current source 410 of FIG. 4. They can be implemented, for example, using "current mirroring," a method that is well known and thus not described in detail here. As in the case of every current source, it is highly desirable to ensure a proper termination for both current source 310 of FIG. 3 and current source 410 of FIG. 4. Current source 410 of FIG. 4 is always properly terminated, by connecting to either VCCS 440 or VCCS 450. In FIG. 3, however, current source 310 is properly terminated only when UP==1. To ensure current source 310 is also always properly terminated, a further embodiment is shown in FIG. 5.

Figure 5:
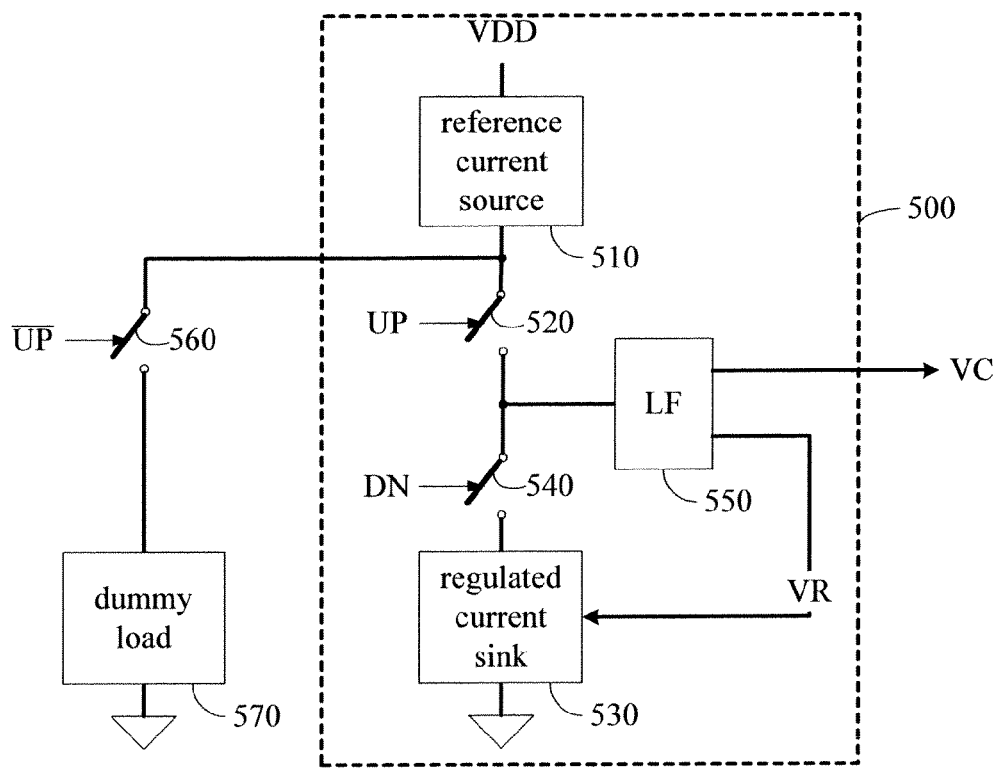
FIG. 5 shows a combined circuit of charge pump and loop filter in a further embodiment of the present invention.

In FIG. 5, the combined circuit 500 of charge pump and loop filter is exactly the same as the combined circuit 300 shown in FIG. 3, and thus is not explained in detail again here. In FIG. 5, however, there are two extra circuit components: a switch 560 control by $\overline{UP}$ (i.e. the logical inversion of the UP signal), and a dummy load 570. When UP==0, the current source 510, which is the same as the current source 310 in FIG. 3, is thus properly terminated by connecting to the dummy load 570. The dummy load 570 usually comprises a resistor or a transistor. To ensure the current source 510 sees the same termination regardless of the state of the UP signal, a yet further embodiment is shown in FIG. 6.

Figure 6:
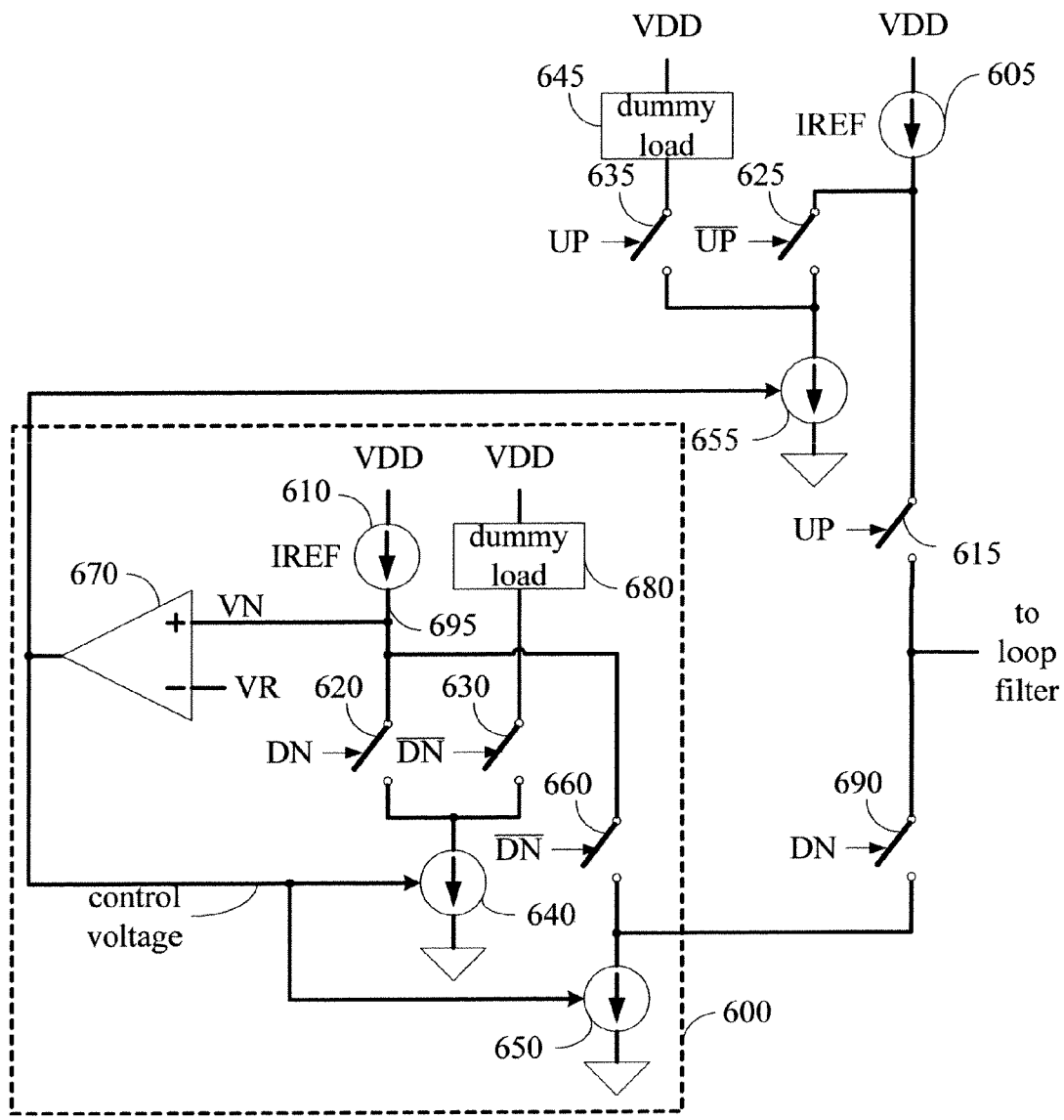
FIG. 6 shows a charge pump circuit in an embodiment.

FIG. 6 shows a charge pump circuit that comprises: a reference current source 605 of magnitude IREF that is connected to the load (i.e. loop filter) through a switch 615 controlled by the UP signal; a regulated current sink 600 that is connected to the load through a switch 690 controlled by the DN signal; and a voltage control current sink (VCCS) 655 that is connected to the reference current source 605 through a switch 625 controlled by $\overline{UP}$, and to a dummy load 645 through a switch 635 controlled by the UP signal. The regulated current sink 600 is exactly the same as the regulated current sink 400 shown in FIG. 4 and is thus not explained in detail again here. The VCCS 655 is constructed from exactly the same circuit as the VCCS 640 and VCCS 650 inside the regulated current sink 600. The control voltage that controls both VCCS 640 and VCCS 650 is also used to control VCCS 655. When UP==1, the reference current source 605 is properly terminated by connecting to the loop filter through switch 615 and VCCS 655 is also properly terminated by connecting to the dummy load 645 through switch 635; when UP==0, the reference current source 605 is connected to the VCCS 655 through switch 625 and therefore both of them are properly terminated.

Still referring to FIG. 6. For those with ordinary skill in the art, a dummy switch circuit (not shown in the figure), which is always turned on, can be inserted right at the output of the current source 610 before the output node is connected to the positive terminal of the operational amplifier 670, as indicated by the location point by the label 695. By inserting the dummy switch, the output of the current source 610 needs to pass through two switches (the dummy switch and switch 660, or the dummy switch and switch 620) to reach VCCS 650 or VCCS 640. On the other hand, the output of the current source 605 also needs to pass through two switches (615 and 690) to reach VCCS 650. The current source 610 therefore sees exactly the same load as the current source 605 does. The performance of the current regulation, therefore, will be very good.

Figure 7:
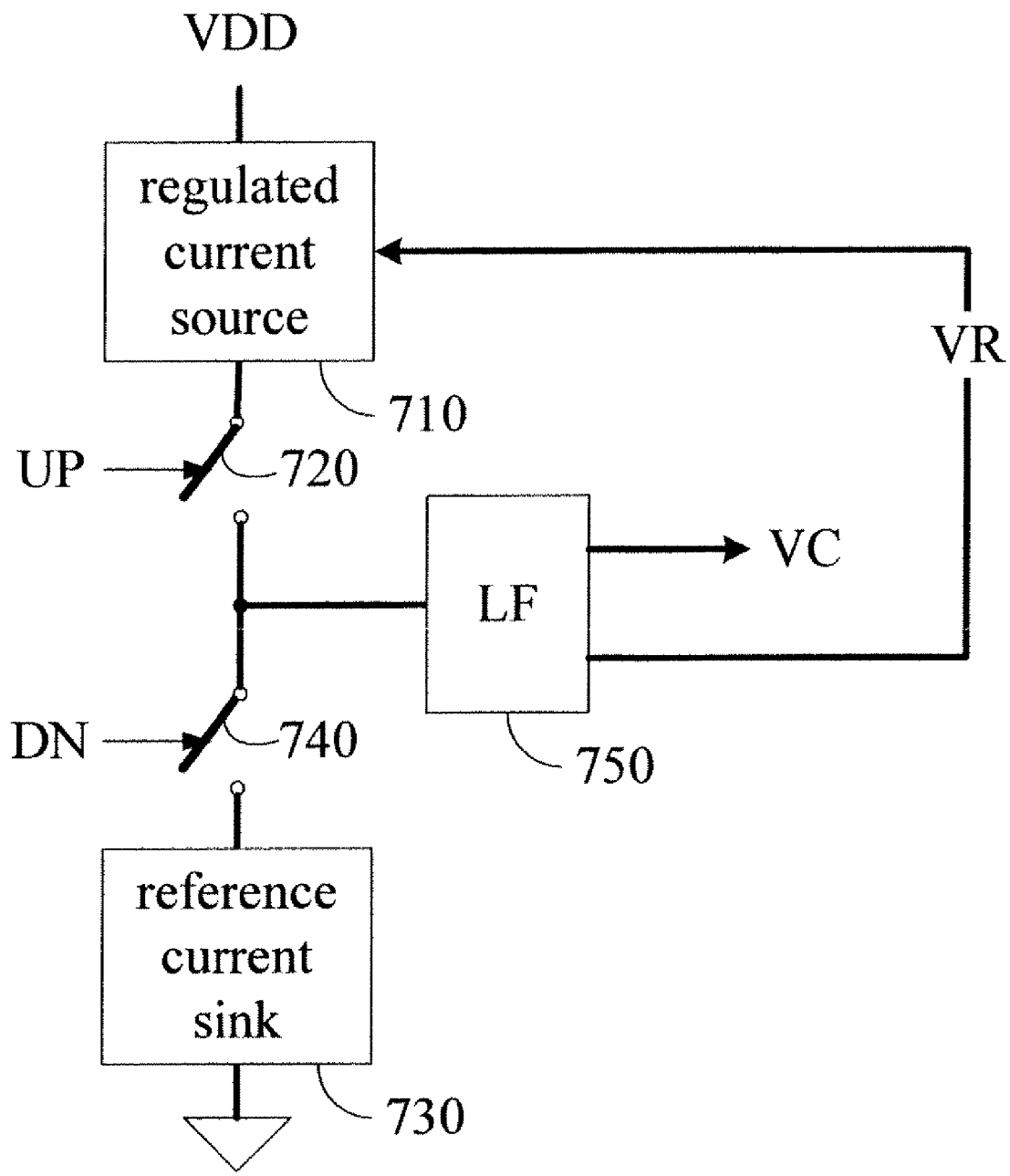
FIG. 7 shows a combined circuit of charge pump and loop filter in an embodiment of the present invention.

For those with ordinary skill in the art, the method taught by the current invention can be easily applied to other circuit configurations. For example, the roles of current sink and current source can be swapped, as demonstrated in an embodiment shown in FIG. 7. Here, a regulated current source 710 is used to generate a regulated positive (i.e. out-flowing) current. A switch 720 controlled by the UP signal is used to enable the positive current to flow out to the loop filter 750. On the other hand, a reference current sink 730 of magnitude IREF is used to generate a reference negative (i.e. in-flowing) current. A switch 740 controlled by the DN signal is used to enable the negative current to flow in from the loop filter 750. The loop filter generates two outputs: VC, and VR. VC is the main output of the loop filter 750, and is provided to a VCO (not shown in the figure) to control its output frequency. VR is obtained from VC using a low pass filtering function, explicitly or implicitly implemented within the loop filter 750. The voltage VR is then provided to the regulated current source 710 as a reference voltage to regulate its output current. The voltage VR represents the average voltage at the load (i.e. loop filter) shared by the current source 710 and the current sink 730. The regulated current source 710 comprises a VCCS (voltage controlled current source) and a feedback circuit. When the voltage of the load increases/decreases, the voltage VR also increases/decreases, and the output current of VCCS tends to decrease/increase due to its finite output resistance. A feedback mechanism within the regulated current source 710, however, senses that change and adjusts the control voltage of the VCCS to boost/reduce the output current to offset the decrease/increase due to the finite output resistance. The output current of the VCCS is thus regulated. For those with ordinary skill in the art, the regulated current source 710 can be implemented in the same manner as of that in the regulated current sink 400 of FIG. 4 by swapping the roles of current source and current sink, and replacing the logical signal DN by the logical signal UP.

Similarly, the principles taught by the embodiments shown in FIG. 5 and FIG. 6 can also be applied in alternative circuit configurations by, for example, swapping the roles of current source and current sink, and swapping the roles of the logical signal DN and the logical signal UP.

In this disclosure, we describe a "current source" as a device sourcing an outgoing current (i.e. outputting a positive current), and we describe a "current sink" as a device sinking an incoming current (i.e. outputting a negative current). In an alternative nomenclature, both types of devices can be described as a "current source," only that the former is a "current source having a positive output current" and the latter is a "current source having a negative output current."

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A circuit comprising:
   a first current source coupled to a first node of a filter circuit via a first switch controlled by a first logical signal;
   a second current source coupled to an output of the first current source via a second switch controlled by an inversion of the first logical signal, wherein the first current source is adjusted based on a voltage of a second node of the filter circuit;
   a third current source coupled to an output of the second current source via a third switch controlled by the first logical signal;
   a fourth current source coupled to the first node of the filter circuit via a fourth switch controlled by a second logical signal; and
   a fifth current source coupled to an output of the fourth current source via a fifth switch controlled by an inversion of the second logical signal.

2. The circuit of claim 1, wherein the first current source is controlled by the voltage output of a feedback, which forces the second current source output voltage to track the voltage of the second node of the filter circuit.

3. The circuit of claim 1 further comprising an amplifier that amplifies a difference between an output voltage of the second current source and the voltage of the second node of the filter circuit to generate a control signal to control the first current source.

4. The circuit of claim 1, wherein the first logical signal is a first value, the circuit works in an output phase; when the first logical signal is a second value, the circuit works in a calibration phase.

5. The circuit of claim 1, wherein the fifth current source is controlled by the control signal.

6. The circuit of claim 5, further comprising a dummy load coupled to an output of the third current source via a sixth switch controlled by the inversion of the first logical signal.

7. The circuit of claim 5 further comprising a dummy load coupled to an output of the fifth current source via a sixth switch controlled by the second logical signal.

8. A method of regulating a current, the method comprising:
   coupling a first current source to a first node of a filter circuit via a first switch controlled by a first logical signal;
   coupling a second current source to an output of the first current source via a second switch controlled by an inversion of the first logical signal;
   coupling a third current source to the output of the second current source via a third switch controlled by the first logical signal; and
   adjusting the first current source based on a voltage of a second node of the filter circuits;
   wherein the step of adjusting the first current source comprises: using an amplifier to amplify a difference between an output voltage of the second current source and the voltage of the second node of the filter circuit to generate a control signal to adjust the first current source.

9. The method of claim 8, wherein the first current source is controlled by the voltage output of a feedback, which forces the second current source output voltage to track the voltage of the second node of the filter circuit.

10. The method of claim 8 farther comprising coupling a fourth current source to the first node of the filter circuit via a fourth switch controlled by a second logical signal.

11. The method of claim 10 farther comprising coupling a fifth current source to an output of the fourth current source via a fifth switch controlled by an inversion of the second logical signal.

12. The method of claim 11 farther comprising adjusting the fifth current source according to the control signal.

13. The method of claim 8 farther comprising adjusting the third current source according to the control signal.

14. A circuit comprising:
a first current source coupled to a first node of a filter circuit via a first switch controlled by a first logical signal;
a second current source coupled to an output of the first current source via a second switch controlled by an inversion of the first logical signal, wherein the first current source is adjusted based on a voltage of a second node of the filter circuit;
a third current source coupled to an output of the second current source via a third switch controlled by the first logical signal; and
an amplifier that amplifies a difference between an output voltage of the second current source and the voltage of the second node of the filter circuit to generate a control signal to control the first current source.

15. The circuit of claim 14, wherein the first current source is controlled by the voltage output of a feedback, which forces the second current source output voltage to track the voltage of the second node of the filter circuit.

16. The circuit of claim 14 further comprising a fourth current source coupled to the first node of the filter circuit via a fourth switch controlled by a second logical signal.

17. The circuit of claim 16 further comprising a fifth current source coupled to an output of the fourth current source via a fifth switch controlled by an inversion of the second logical signal.

18. The circuit of claim 17, wherein the fifth current source is controlled by the control signal.

19. The circuit of claim 18 further comprising a dummy load coupled to an output of the third current source via a sixth switch controlled by the inversion of the first logical signal.

20. The circuit of claim 18 further comprising a dummy load coupled to an output of the fifth current source via a sixth switch controlled by the second logical signal.

21. A method of regulating a current of a circuit which is coupled to a filter circuit, the method comprising:
coupling a first current source to a first node of the filter circuit via a first switch controlled by a first logical signal;
coupling a second current source to an output of the first current source via a second switch controlled by an inversion of the first logical signal;
coupling a third current source to the output of the second current source via a third switch controlled by the first logical signal;
adjusting the first current source based on a voltage of a second node of the filter circuit; and
adjusting the third current source based on the voltage of the second node of the filter circuit.

22. The method of claim 21, wherein the first current source is controlled by the voltage output of a feedback, which forces the second current source output voltage to track the voltage of the second node of the filter circuit.

23. The method of claim 21, wherein the step of adjusting the first current source comprises; using an amplifier to amplify a difference between an output voltage of the second current source and the voltage of the second node of the filter circuit to generate a control signal to adjust the first current source.

24. The method of claim 21 farther comprising coupling a fourth current source to the first node of the filter circuit via a fourth switch controlled by a second logical signal.

25. The method of claim 24 farther comprising coupling a fifth current source to an output of the fourth current source via a fifth switch controlled by an inversion of the second logical signal.

26. The method of claim 25 farther comprising adjusting the fifth current source based on the voltage of the second node of the filter circuit.

27. The method of claim 21, wherein the first logical signal is a first value, the circuit works in an output phase; when the first logical signal is a second value, the circuit works in a calibration phase.

* * * * *